(12) United States Patent
Gu (10) Patent No.: US 9,170,305 B2
(45) Date of Patent: Oct. 27, 2015

(54) BATTERY MANAGEMENT SYSTEM AND METHOD OF CONTROLLING THE SAME (75) Inventor: Jae-Sung Gu, Yongin-si (KR)

(73) Assignees: Samsung SDI Co., Ltd., Yongin-si (KR); Robert Bosch GmbH, Stuttgart (DE)

( * ) Notice: Subject to any disclaimer, the term of this patent is extended or adjusted under 35 U.S.C. 154(b) by 622 days.

(21) Appl. No.: 13/396,360

(22) Filed: Feb. 14, 2012

(65) Prior Publication Data
US 2012/0256599 A1 Oct. 11, 2012

(30) Foreign Application Priority Data

Apr. 7, 2011 (KR) .................. 10-2011-0032190

(51) Int. Cl.
*H02J 7/04* (2006.01)
*H02J 7/16* (2006.01)
*G01R 31/36* (2006.01)
*B60L 11/18* (2006.01)
*H02J 7/00* (2006.01)

(52) U.S. Cl.
CPC ......... *G01R 31/3679* (2013.01); *B60L 11/1861* (2013.01); *H02J 7/0077* (2013.01); *H02J 7/0014* (2013.01); *H02J 7/0086* (2013.01); *Y02T 10/705* (2013.01); *Y02T 10/7005* (2013.01); *Y02T 10/7044* (2013.01); *Y02T 10/7055* (2013.01)

(58) Field of Classification Search
USPC .......................................... 320/149; 324/427
See application file for complete search history.

(56) References Cited

U.S. PATENT DOCUMENTS 7,317,299 B2   1/2008  Koo
2003/0025481 A1*  2/2003  Bertness .................. 320/155
(Continued)

FOREIGN PATENT DOCUMENTS

JP   2004-177373 A   6/2004
JP   2007-078506 A   3/2007
(Continued)

OTHER PUBLICATIONS

Korean Office Action dated Aug. 24, 2012 for Korean Patent Application No. KR 10-2011-0032190 which corresponds to captioned U.S. Appl. No. 13/396,360.

*Primary Examiner* — Richard Isla Rodas
*Assistant Examiner* — David V Henze-Gongola
(74) *Attorney, Agent, or Firm* — Christie, Parker & Hale, LLP (57) ABSTRACT

A battery management system (BMS) and a method of controlling the same are disclosed. In one embodiment, the BMS includes a reference setup unit configured to set a charge completion value used to calculate a state of health (SOH) of the battery, wherein the battery comprises one or more battery packs each including a plurality of battery cells, and a charge amount calculation unit configured to calculate an amount actually charged in the battery from a first point in time when charging of the battery begins to a second point in time when the battery charging actually reaches the charge completion value. The BMS may further include an SOH calculation unit configured to calculate the SOH of the battery based on a ratio of i) the actual charge amount to ii) a preset charge amount expected to be charged from the first time point to the second time point.

20 Claims, 3 Drawing Sheets (56) References Cited

U.S. PATENT DOCUMENTS

| | | | |
|---|---|---|---|
| 2003/0184307 A1* | 10/2003 | Kozlowski et al. | 324/427 |
| 2006/0276980 A1* | 12/2006 | Mizuno et al. | 702/63 |
| 2007/0090803 A1 | 4/2007 | Yun et al. | |
| 2010/0036626 A1 | 2/2010 | Kang et al. | |
| 2010/0198536 A1 | 8/2010 | Hess | |
| 2011/0119005 A1* | 5/2011 | Majima et al. | 702/63 |
| 2012/0293122 A1* | 11/2012 | Murawaka | 320/109 |

FOREIGN PATENT DOCUMENTS

| | | |
|---|---|---|
| JP | 2010-139396 A | 6/2010 |
| KR | 10-0736995 B1 | 7/2007 |
| KR | 10-2010-0019660 A | 2/2010 |
| KR | 10-2010-0063343 A | 6/2010 |
| KR | 10-0970841 B1 | 7/2010 |
| WO | WO 2010004984 A1 * | 1/2010 |

* cited by examiner

BATTERY MANAGEMENT SYSTEM AND METHOD OF CONTROLLING THE SAME

RELATED APPLICATIONS

This application claims the benefit of Korean Patent Application No. 10-2011-0032190, filed on Apr. 7, 2011, in the Korean Intellectual Property Office, the disclosure of which is incorporated herein in its entirety by reference.

BACKGROUND

1. Field

The described technology generally relates to a battery management system (BMS), and more particularly, to a BMS having a function of detecting the lifetime of a battery used in electric or hybrid vehicles, and a method of controlling the BMS.

2. Description of the Related Technology

Vehicles using an internal combustion engine cause serious environmental problems due to air pollution. Thus, to reduce harm to the environment, much effort is being made on developing all electric, hybrid or plug-in hybrid vehicles (xEVs).

Electric vehicles use a motor powered by a battery as a driving source, instead of an internal combustion engine, and thus, they generate no exhaust gas and little noise. Such an electric vehicle battery generally includes a plurality of secondary battery cells that are rechargeable and dischargeable and formed into one pack or module.

Hybrid vehicles are a hybrid form of electric vehicles and internal combustion engine vehicles. Also, research is underway on mixed-type hybrid vehicles which use an internal combustion engine and fuel cells for directly obtaining electric energy from chemical reactions while continuously supplying hydrogen and oxygen, or using a battery and fuel cells.

Since the performance of a battery directly influences the performance of electric vehicles, the performance of each battery cell also affects the overall performance of such vehicles.

SUMMARY

One inventive aspect is a battery management system (BMS) capable of efficiently managing a charge or discharge state of each battery cell by measuring a voltage of each battery cell, or a voltage and a current of a battery.

Another aspect is a battery management system (BMS) capable of calculating a state of health (SOH) of a battery under restricted conditions, and a method of controlling the same.

Another aspect is a battery management system (BMS) of an electric vehicle having a battery including at least one pack formed of a plurality of battery cells, and using the battery as a power source, includes a reference setup unit for setting a charge termination value used to calculate a state of health (SOH) of the battery; a charge amount calculation unit for calculating an amount actually charged in the battery from a point of time when charging of the battery is started to a point of time when the charge termination value is actually reached; and an SOH calculation unit for calculating the SOH of the battery with reference to a ratio between the actual charge amount and a preset expected charge amount from the point of time when the charging is started and a point of time when the charge termination value is expected to be reached.

The charging of the battery may include low-speed charging or high-speed charging.

The charge termination value may be a reference voltage of the battery.

The charge termination value may be a state of charge (SOC) of the battery.

The SOH calculation unit may calculate the SOH of the battery as represented in Equation 1.

$$\text{Aging} = \frac{Ah_{Actual\_Input}}{Ah_{Expected\_input}} = \frac{\frac{Ah_{Actual\_Input}}{\Delta SOC_{ref1 \to ref2}}}{\frac{Ah_{Expected\_Input}}{\Delta SOC_{ref1 \to ref2}}} = \frac{Ah_{Aged}}{Ah_{BOL}} \quad \text{[Equation 1]}$$

Here, $Ah_{Actual\_Input}=Ah_{Aged}$ may refer to an actual charge amount, and $Ah_{Expected\_Input}=Ah_{BOL}$ may refer to an expected charge amount.

Another aspect is a method of controlling a battery management system (BMS) of an electric vehicle having a battery including at least one pack formed of a plurality of battery cells, and using the battery as a power source, includes charging the battery; calculating an amount actually charged in the battery from a point of time when the charging of the battery is started to a point of time when a charge termination value is actually reached; and calculating a state of health (SOH) of the battery with reference to a ratio between the actual charge amount and a preset expected charge amount from the point of time when the charging is started and a point of time when the charge termination value is expected to be reached.

The method may further include setting the charge termination value used to calculate the SOH of the battery.

The method may further include estimating a distance to empty (DTE) of the vehicle with reference to the calculated SOH.

The method may further include a state of charge (SOC) of the battery with reference to the calculated SOH.

The charge termination value may be a reference voltage of the battery.

The charge termination value may be an SOC of the battery. Another aspect is a battery management system (BMS) of an electric vehicle having a battery, the BMS comprising: a reference setup unit configured to set a charge completion value used to calculate a state of health (SOH) of the battery, wherein the battery comprises one or more battery packs each including a plurality of battery cells; a charge amount calculation unit configured to calculate an amount actually charged in the battery from a first point in time when charging of the battery begins to a second point in time when the battery charging actually reaches the charge completion value; and an SOH calculation unit configured to calculate the SOH of the battery based on a ratio of i) the actual charge amount to ii) a preset charge amount expected to be charged from the first time point to the second time point.

In the above BMS, the charging of the battery comprises low-speed charging or high-speed charging. In the above BMS, the charge completion value is a reference voltage of the battery. In the above BMS, the reference voltage is a voltage of the battery when fully charged. 5. The BMS of claim 1, wherein the charge completion value is a state of charge (SOC) of the battery. In the above BMS, the SOC is about 100% at the charge completion value.

In the above BMS, the SOH calculation unit calculates the SOH of the battery as represented in Equation 1.

$$\text{Aging} = \frac{Ah_{Actual\_Input}}{Ah_{Expected\_input}} = \frac{\frac{Ah_{Actual\_Input}}{\Delta SOC_{ref1 \to ref2}}}{\frac{Ah_{Expected\_Input}}{\Delta SOC_{ref1 \to ref2}}} = \frac{Ah_{Aged}}{Ah_{BOL}} \quad \text{[Equation 1]}$$

wherein $Ah_{Actual\_Input} = Ah_{Aged}$ refers to an actual charge amount, and $Ah_{Expected\_Input} = Ah_{BOL}$ refers to an expected charge amount.

The above BMS further comprises a communication unit configured to communicate the state of the battery to a controller of the BMS based on the calculated SOH.

Another aspect is a method of controlling a battery management system (BMS) of an electric vehicle having a battery, the method comprising: charging the battery, wherein the battery comprises one or more battery packs each including a plurality of battery cells; calculating an amount actually charged in the battery from a first point in time when the charging of the battery begins to a second point in time when the battery charging actually reaches a charge completion value; and calculating a state of health (SOH) of the battery based on a ratio of i) the actual charge amount to ii) a preset charge amount expected to be charged from the first time point to the second time point.

The above method further comprises setting the charge completion value used to calculate the SOH of the battery. The above method further comprises estimating a distance to empty (DTE) of the vehicle based on the calculated SOH. The above method further comprises calculating a state of charge (SOC) of the battery based on the calculated SOH. In the above method, the charge completion value is a reference voltage of the battery.

In the above method, the charge completion value is a value measured when the battery is initially used after being produced. In the above method, the charge completion value is a value measured while the battery is being charged when the battery is initially used. In the above method, the charge completion value is an SOC of the battery.

Another aspect is a battery management system (BMS) of an electric vehicle having a battery, the BMS comprising: a reference setup device configured to set a charge completion value, wherein the battery comprises at least one battery pack; a charge amount calculator configured to calculate an amount actually charged in the battery during a time period; and an SOH calculator configured to calculate the SOH of the battery based on a ratio of i) the actual charge amount to ii) a preset charge amount expected to be charged during the time period.

In the above BMS, the time period is defined between a first point in time when charging of the battery begins and a second point in time when the battery charging actually reaches the charge completion value. The above BMS further comprises a communication unit configured to communicate the state of the battery to a controller of the BMS based on the calculated SOH.

In the above BMS, the SOH calculation unit calculates the SOH of the battery as represented in Equation 1.

$$\text{Aging} = \frac{Ah_{Actual\_Input}}{Ah_{Expected\_input}} = \frac{\frac{Ah_{Actual\_Input}}{\Delta SOC_{ref1 \to ref2}}}{\frac{Ah_{Expected\_Input}}{\Delta SOC_{ref1 \to ref2}}} = \frac{Ah_{Aged}}{Ah_{BOL}} \quad \text{[Equation 1]}$$

wherein $Ah_{Actual\_Input} = Ah_{Aged}$ refers to an actual charge amount, and $Ah_{Expected\_Input} = Ah_{BOL}$ refers to an expected charge amount.

DETAILED DESCRIPTION

Reference will now be made in detail to embodiments, examples of which are illustrated in the accompanying drawings, wherein like reference numerals refer to like elements throughout. The described embodiments may have different forms and should not be construed as being limited to the descriptions set forth herein.

Figure 1:
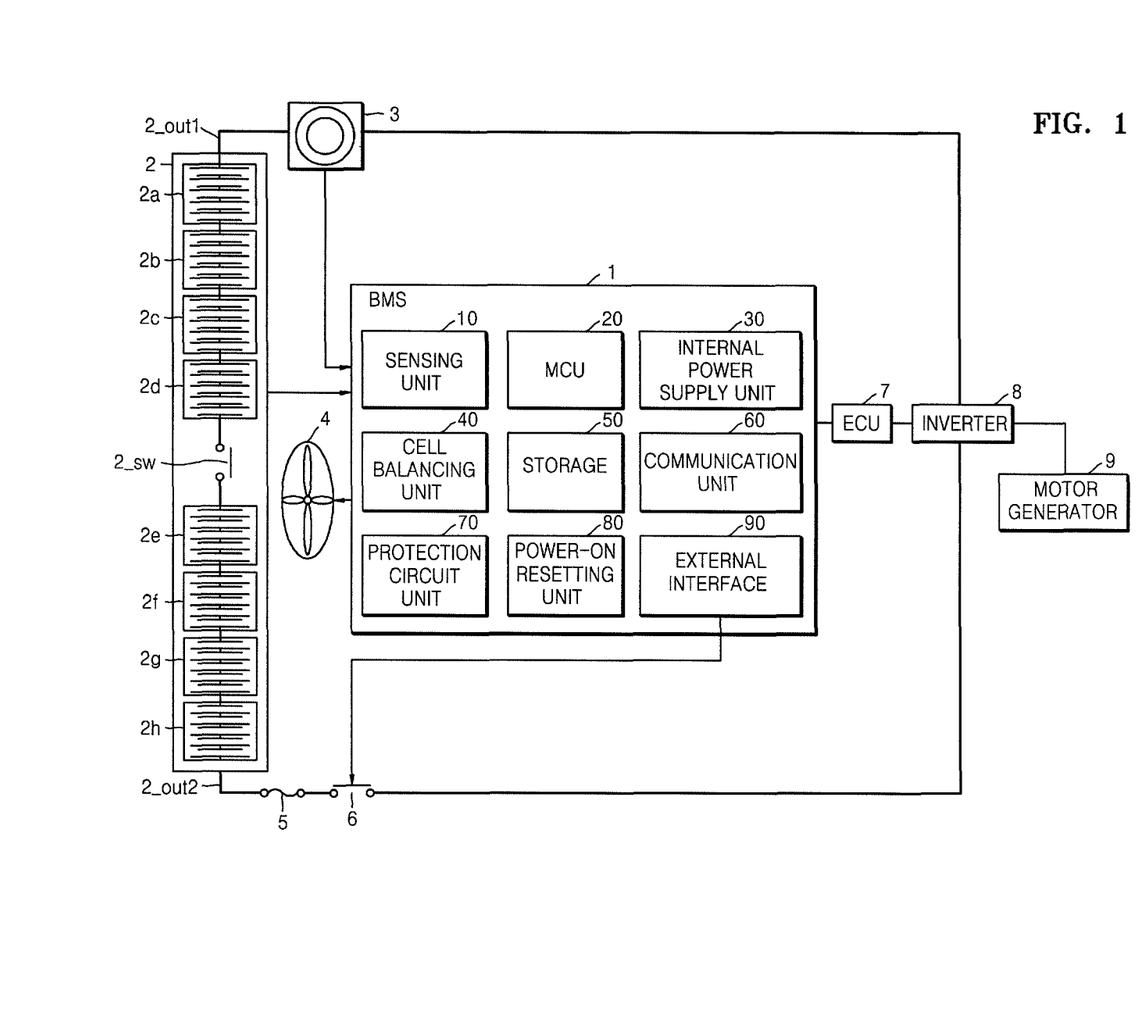
FIG. 1 is a schematic diagram of a battery, a battery management system (BMS), and peripheral devices of the BMS, according to an embodiment.

FIG. 1 is a schematic diagram of a battery 2, a battery management system (BMS) 1, and peripheral devices of the BMS 1, according to an embodiment.

As illustrated in FIG. 1, a vehicle system includes the BMS 1, the battery 2, a current sensor 3, a cooling fan 4, a fuse 5, a main switch 6, an engine control unit (ECU) 7, an inverter 8, and a motor generator 9. The vehicle system may include additional elements or omit some of the above elements depending on the embodiment.

Initially, the battery 2 includes a plurality of sub-packs 2a through 2h in each of which a plurality of battery cells are connected in series, output terminals 2_OUT1 and 2_OUT2, and a safety switch 2_SW disposed between the sub-packs 2d and 2e. Here, although eight sub-packs are included and each sub-pack includes a group of a plurality of battery cells, they are not considered limiting. Also, the safety switch 2_SW is disposed between the sub-packs 2d and 2e and may be manually turned on or off to replace or operate the battery 2 to ensure the safety of a worker. Although the safety switch 2_SW is disposed between the sub-packs 2d and 2e, the safety switch 2_SW may be installed in other positions. In one embodiment, the output terminals 2_OUT1 and 2_OUT2 are electrically connected to the inverter 8.

The current sensor 3 measures and outputs an output current of the battery 2 to a sensing unit 10 of the BMS 1. The current sensor 3 may be a hall current transformer (CT) for measuring a current with the use of, for example, a Hall effect sensor and outputting an analog current signal corresponding to the measured current.

The cooling fan 4 cools heat generated due to charging or discharging of the battery 2, based on a control signal received from the BMS 1, and thus prevents deterioration of the battery 2 and reduction in charge or discharge efficiency that may be caused by an increase in temperature.

The fuse 5 prevents an over current being provided to the battery 2. In one embodiment, if an over current is generated, the fuse 5 is broken to block the over current from being input to the battery 2.

The main switch 6 turns on or off the battery 2 based on a control signal received from the BMS 1 or the ECU 7 of the vehicle if an abnormal phenomenon such as an over voltage, an over current, or a high temperature occurs.

In one embodiment, the BMS 1 includes the sensing unit 10, a main control unit (MCU) 20, an internal power supply unit 30, a cell balancing unit 40, a storage 50, a communication unit 60, a protection circuit unit 70, a power-on resetting unit 80, and an external interface 90. The BMS 1 may include additional elements or omit some of the above elements depending on the embodiment.

In one embodiment, the sensing unit 10 obtains and transmits information regarding a pack current, a pack voltage, a cell voltage, a cell temperature, and a cell ambient temperature to the MCU 20.

In one embodiment, the MCU 20 calculates a state of charge (SOC) of the battery 2 based on the information regarding the pack current, the pack voltage, the cell voltage, the cell temperature, and the cell ambient temperature received from the sensing unit 10, and generates information regarding the SOC of the battery 2. In this embodiment, when the battery 2 is charged, the MCU 20 calculates a state of health (SOH) of the battery 2 based on an actual charge amount and an expected charge amount of the battery 2. Since the SOH is calculated under restricted conditions, e.g., when the battery 2 is charged, in comparison to calculating variations in resistance of the battery 2 while the vehicle is moving, it is generally an accurate calculation. During vehicle movement, it may not be easy to accurately calculate the SOH. In one embodiment, estimating of the SOH or an aging level of the battery 2 is an important factor in calculating remaining power or the SOC of the battery 2, or estimating a distance to empty (DTE) of the vehicle using the battery 2 as a power source, e.g., an electric vehicle or a hybrid vehicle. The SOH calculation will be described below with reference to FIGS. 2 and 3. The MCU 20 uses the calculated SOH to calculate the DTE of the vehicle or the SOC of the battery 2.

The internal power supply unit 30 generally supplies power from an auxiliary battery to the BMS 1. The cell balancing unit 40 balances the SOC between cells. That is, the cell balancing unit 40 may discharge a cell having a relatively high level of the SOC and may charge a cell having a relatively low level of the SOC. The storage 50 stores data such as a current SOC and a current SOH when the BMS 1 is powered off. Here, the storage 50 may be an electrically writable and erasable non-volatile storage such as electrically erasable programmable read-only memory (EEPROM). The communication unit 60 communicates with the ECU 7 of the vehicle. The communication unit 60 transmits information regarding the SOC and the SOH from the BMS 1 to the ECU 7, or transmits information regarding the vehicle from the ECU 7 to the MCU 20. The protection circuit unit 70 protects the battery 2 from an external impact, an over current, a low voltage, etc. by using, for example, firmware. The power-on resetting unit 80 resets the whole vehicle if the BMS 1 is powered on. The external interface 90 is a device for connecting auxiliary devices of the BMS 1, e.g., the cooling fan 4 and the main switch 6, to the MCU 20. Although only the cooling fan 4 and the main switch 6 are illustrated, the BMS 1 may include other auxiliary devices.

In one embodiment, the ECU 7 checks a current state of the vehicle based on information regarding, for example, an accelerator, a break, and a speed of the vehicle, and determines information regarding, for example, required torque. For example, the current state of the vehicle includes a key-on state, a key-off state, a constant speed state, or an accelerating state. The ECU 7 transmits information regarding the current state of the vehicle to the communication unit 60 of the BMS 1. The ECU 7 controls an output of the motor generator 9 to match torque information. For example, the ECU 7 controls a switch of the inverter 8 to control the output of the motor generator 9 to match the torque information. Also, the ECU 7 receives the information regarding the SOC of the battery 2 from the MCU 20 via the communication unit 60 of the BMS 1 and controls the SOC of the battery 2 to a target value (for example, about 55%). In one embodiment, if the information regarding the SOC transmitted from the MCU 20 represents a value less than or equal to about 55%, the ECU 7 controls the switch of the inverter 8 to charge the battery 2 by outputting power toward the battery 2. In this case, a pack current Ip has a negative (−) value. In another embodiment, if the information regarding the SOC represents a value greater than about 55%, the ECU 7 controls the switch of the inverter 8 to discharge the battery 2 by outputting power toward the motor generator 9. In this case, the pack current Ip has a positive (+) value.

The inverter 8 allows the battery 2 to be charged or discharged, based on a control signal received from the ECU 7.

The motor generator 9 drives the vehicle based on the electric energy of the battery 2 and the torque information received from the ECU 7.

The ECU 7 may prevent the battery 2 from being overcharged or overdischarged by charging or discharging the battery 2 by a chargeable or dischargeable amount of power based on the SOC of the battery 2, and thus may allow the battery 2 to be efficiently used for a long time. However, since the information regarding the SOC of the battery 2 may not be easily obtained after the battery 2 is mounted on the vehicle, in one embodiment, the BMS 1 accurately estimates and transmits the information regarding the SOC to the ECU 7 by using the information regarding the pack current, the pack voltage, the cell temperature, etc., which is obtained by the sensing unit 10.

Figure 2:
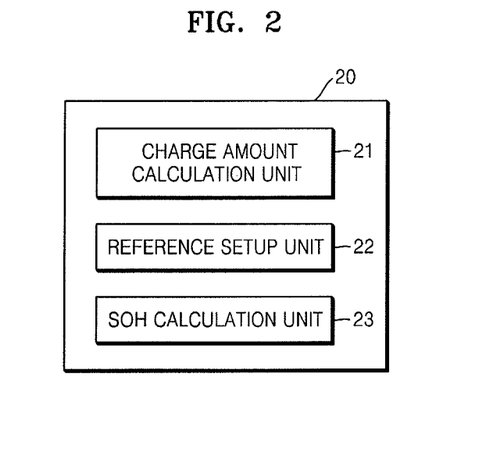
FIG. 2 is a schematic diagram of a main control unit (MCU) illustrated in FIG. 1.

FIG. 2 is a schematic diagram of the MCU 20 illustrated in FIG. 1.

Referring to FIG. 2, the MCU 20 includes a charge amount calculation unit 21, a reference setup unit 22, and an SOH calculation unit 23. Here, although the above elements are all included in the MCU 20, they are not considered limiting, for example, the above elements may be included in the BMS 1 or an external device.

The charge amount calculation unit 21 calculates a charge amount of the battery 2. In one embodiment, charging includes low-speed charging or high-speed charging, and the charge amount is calculated by measuring an amount actually charged in the battery 2, i.e., an actual charge amount, from a point in time (or a first point in time) when charging begins to a point in time (or a second point in time) when the battery charging actually reaches a charge termination value (or a charge completion value) such as a reference voltage of the battery 2, e.g., about 300V, or a reference SOC of the battery 2, e.g., SOC of about 100%.

The reference setup unit 22 sets the charge termination value. The reference setup unit 22 sets the charge termination value to be reached when the battery 2 is charged. Here, the charge termination value may be a full charge voltage or SOC about 100% of the battery 2.

The SOH calculation unit 23 calculates an SOH of the battery 2 based on a ratio between the actual charge amount calculated by the charge amount calculation unit 21 and an amount expected to be charged in the battery 2, i.e., an expected charge amount, from the point of time when the charging begins to a point of time when the charge termination value is expected to be reached. In one embodiment, the SOH calculation unit 23 calculates the SOH as represented in Equation 1 below.

$$\text{Aging} = \frac{Ah_{Actual\_Input}}{Ah_{Expected\_input}} = \frac{\frac{Ah_{Actual\_Input}}{\Delta SOC_{ref1 \rightarrow ref2}}}{\frac{Ah_{Expected\_Input}}{\Delta SOC_{ref1 \rightarrow ref2}}} = \frac{Ah_{Aged}}{Ah_{BOL}} \quad \langle \text{Equation 1} \rangle$$

Here, aging has the same meaning as an SOH. $Ah_{Actual\_Input} = Ah_{Aged}$ refers to an actual charge amount, and $Ah_{Expected\_Input} = Ah_{BOL}$ refers to an expected charge amount. An example according to Equation 1 will now be described with reference to FIG. 3.

Figure 3:
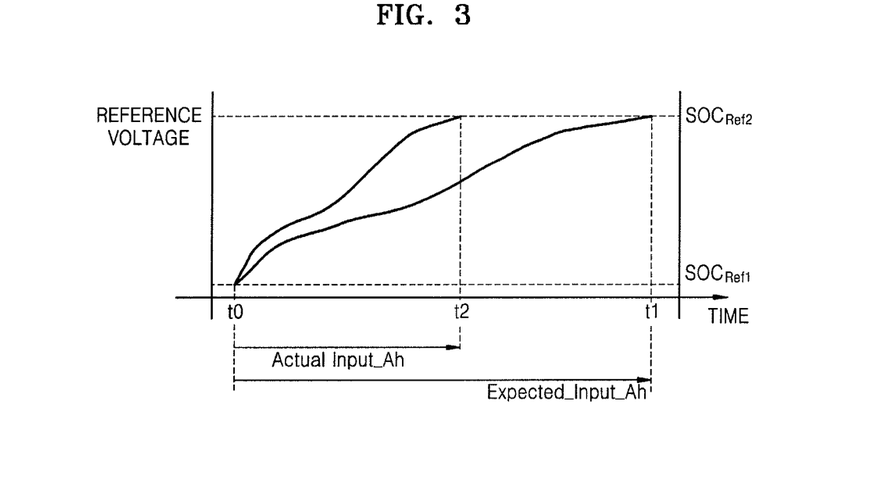
FIG. 3 is a graph for describing a method of estimating a state of health (SOH) of a battery, according to an embodiment.

Referring to FIG. 3, Actual_Input_Ah is an amount actually charged in a battery, i.e., an actual charge amount, from a point of time t0 to a point of time t2 when a reference voltage or a reference SOC used to calculate an SOH is actually reached. Expected_Input_Ah is an amount expected to be charged in the battery, i.e., an expected charge amount, from the point of time t0 to a point of time t1 when the reference voltage or the reference SOC used to calculate the SOH is expected to be reached. For example, when an SOC at the point of time to is 20% and the reference SOC used to calculate the SOH is 100%, if the expected charge amount from the point of time t0 to the point of time t1 is 80 Ah and the actual charge amount from the point of time t0 to the point of time t2 is 64 Ah, $Ah_{Aged}$ and $Ah_{BOL}$ are respectively calculated as represented in Equations 2 and 3 below. In Equations 2 and 3, Ah means ampere-hour.

$$Ah_{Aged} = \frac{Ah_{actual\_input}}{\Delta SOC_{t0 \to t2}} = \frac{64}{0.8} = 80[Ah] \qquad \langle \text{Equation 2} \rangle$$

$$Ah_{BOL} = \frac{Ah_{expected\_input}}{\Delta SOC_{t0 \to t2}} = \frac{80}{0.8} = 100[Ah] \qquad \langle \text{Equation 3} \rangle$$

If $Ah_{Aged}$ and $Ah_{BOL}$ calculated by using Equations 2 and 3 are substituted in Equation 1, the SOH is calculated as 0.8. Here, 0.8 is a value regarded as an SOH index, an aging factor, or an aging level. In one embodiment, if the SOH is greater than a certain level (e.g., about 0.55), the BMS can determine that the battery is in a good condition. In another embodiment, if the SOH is less than a certain level (e.g., about 0.3 or about 0.4), the BMS can determine that the battery is in a poor condition. In another embodiment, if the SOH is in a certain range (e.g., about 0.4 to about 0.55), the BMS can determine that the battery is in an intermediate state. In the above embodiments, the communication unit 60 may communicate the state of the battery to the ECU 7 of the vehicle, wherein the communication may include, but not limited to, a warning signal. Depending on the embodiment, the above numbers may change.

Although the initial SOC is set as 20% and the reference SOC is set as 100% in the above example, they are not considered limiting. Also, in addition to the reference SOC, a battery reference voltage or a battery full charge voltage may be set as the reference voltage.

Figure 4:
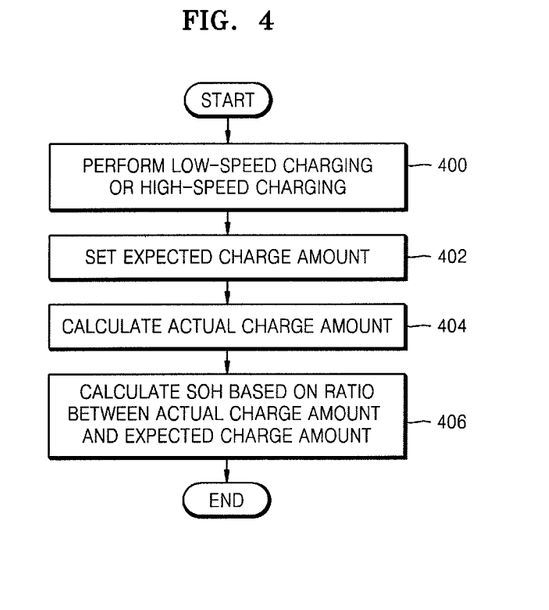
FIG. 4 is a flowchart of a method of controlling a BMS, according to an embodiment.

FIG. 4 is a flowchart of a method of controlling a BMS according to an embodiment. Depending on the embodiment, the order of the operations shown in FIG. 4 may be changed, certain operations may be omitted, and additional operations may be added.

Referring to FIG. 4, in operation 400, low-speed charging or high-speed charging is performed. Here, an SOH of a battery is calculated while the battery is being charged, and the battery is not limited to the low-speed or high-speed charging.

In operation 402, an expected charge amount is set. The expected charge amount is an amount expected to be charged in the battery from a point of time when charging begins to a point of time when a charge termination value is expected to be reached. Here, the charge termination value may be arbitrarily set, and may be set as a battery SOC or a battery voltage. For example, the charge termination value may be set as a battery SOC of about 100% or a battery voltage of about 300 V, and may be a value measured when the battery is initially used after being produced, or a value measured while the battery is being charged when the battery is initially used.

In operation 404, an amount actually charged in the battery is calculated according to the charging performed in operation 400. As discussed above, an actual charge amount is an amount actually charged from the time point when the charging begins to the time point when the battery charging actually reaches the charge termination value.

In operation 406, an SOH is calculated based on a ratio between the actual charge amount calculated in operation 404 and the expected charge amount set in operation 402. Here, the SOH is calculated as represented in Equation 1.

Although not shown in FIG. 4, the method may further comprise estimating an SOC or calculating a DTE of a vehicle by using the calculated SOH.

The device described herein may comprise a processor, a memory for storing program data and executing it, a permanent storage device such as a disk drive, a communications port for handling communications with external devices, and user interface devices, including a touch panel, keys, buttons, etc. When software modules or algorithms are involved, these software modules may be stored as program instructions or computer readable codes executable on the processor on a computer-readable medium. Examples of the computer-readable recording medium include magnetic storage media (e.g., ROM, floppy disks, hard disks, etc.), and optical recording media (e.g., CD-ROMs, or DVDs). The computer readable recording medium can also be distributed over network coupled computer systems so that the computer readable code is stored and executed in a distributed fashion. This media can be read by the computer, stored in the memory, and executed by the processor.

All references, including publications, patent applications, and patents, cited herein are hereby incorporated by reference to the same extent as if each reference were individually and specifically indicated to be incorporated by reference and were set forth in its entirety herein.

For the purposes of promoting an understanding of the principles of the invention, reference has been made to embodiments illustrated in the drawings, and specific language has been used to describe these embodiments. However, the disclosed embodiments are not considered limiting and are intended to encompass variations and modifications that would normally occur to one of ordinary skill in the art.

At least one of the disclosed embodiments may be described in terms of functional block components and various processing steps. Such functional blocks may be realized by any number of hardware and/or software components configured to perform the specified functions. For example, at least one of the disclosed embodiments may employ various integrated circuit components, e.g., memory elements, processing elements, logic elements, look-up tables, and the like, which may carry out a variety of functions under the control of one or more microprocessors or other control devices. Similarly, where embodiments are implemented using software programming or software elements, they may be implemented with any programming or scripting language such as C, C++, Java, assembler, or the like, with the various algorithms being implemented with any combination of data structures, objects, processes, routines or other programming elements. Functional aspects may be implemented in algorithms that execute on one or more processors. Furthermore, the disclosed embodiments could employ any number of conventional techniques for electronics configuration, signal processing and/or control, data processing and the like. The words "mechanism", "element", "means", and "configuration" are used broadly and are not limited to mechanical or physical embodiments, but can include software routines in conjunction with processors, etc.

The particular implementations shown and described herein are illustrative examples and are not considered limiting. For the sake of brevity, conventional electronics, control systems, software development and other functional aspects of the systems may not be described in detail. Furthermore, the connecting lines, or connectors shown in the various figures presented are intended to represent exemplary functional relationships and/or physical or logical couplings between the various elements. It should be noted that many alternative or additional functional relationships, physical connections or logical connections may be present in a practical device.

The use of the terms "a" and "an" and "the" and similar referents in the context of describing the invention (especially in the context of the following claims) are to be construed to cover both the singular and the plural. Furthermore, recitation of ranges of values herein are merely intended to serve as a shorthand method of referring individually to each separate value falling within the range, unless otherwise indicated herein, and each separate value is incorporated into the specification as if it were individually recited herein. Finally, the steps of all methods described herein can be performed in any suitable order unless otherwise indicated herein or otherwise clearly contradicted by context. The use of any and all examples, or exemplary language (e.g., "such as") provided herein, is intended merely to better describe disclosed embodiments and are not considered limiting. Numerous modifications and adaptations will be readily apparent to those of ordinary skill in the art without departing from the spirit and scope of the following claims.

What is claimed is:

1. A battery management system (BMS) of an electric vehicle having a battery, the BMS comprising:
    a reference setup unit configured to set a charge completion value used to calculate a state of health (SOH) of the battery, wherein the battery comprises one or more battery packs each including a plurality of battery cells;
    a charge amount calculation unit configured to calculate an amount actually charged in the battery from a first point in time when charging of the battery begins to a second point in time when the battery charging actually reaches the charge completion value; and
    an SOH calculation unit configured to calculate the SOH of the battery, while the battery is being charged, wherein the SOH of the battery is calculated based on a ratio of i) the amount actually charged in the battery to ii) a preset charge amount expected to be charged from the first point in time to the second point in time,
    wherein the charge completion value is a state of charge (SOC) which is lower than 100%,
    or a voltage of the battery which is lower than the voltage when the battery is fully charged.

2. The BMS of claim 1, wherein the charging of the battery comprises low-speed charging or high-speed charging.

3. The BMS of claim 1, wherein the charge completion value is a reference voltage of the battery.

4. The BMS of claim 3, wherein the reference voltage is a voltage of the battery when fully charged.

5. The BMS of claim 1, wherein the charge completion value is a state of charge (SOC) of the battery.

6. The BMS of claim 5, wherein the SOC is about 100% at the charge completion value.

7. The BMS of claim 1, wherein the SOH calculation unit (operation processing part 50) calculates the SOH of the battery as represented in Equation 1:

$$Aging = \frac{Ah_{ActualInput}}{Ah_{ExpectedInput}} = \frac{\frac{Ah_{ActualInput}}{\Delta SOC_{ref1 \to ref2}}}{\frac{Ah_{ExpectedInput}}{\Delta SOC_{ref1 \to ref2}}} = \frac{Ah_{Aged}}{Ah_{BOL}} \quad \text{[Equation 1]}$$

wherein $Ah_{ActualInput} = Ah_{Aged}$ refers to an actual charge amount, and $Ah_{ExpectedInput} = Ah_{BOL}$ refers to an expected charge amount.

8. The BMS of claim 1, further comprising a communication unit configured to communicate the state of the battery to a controller of the BMS based on the calculated SOH.

9. A method of controlling a battery management system (BMS) of an electric vehicle having a battery, the method comprising:
    charging the battery, wherein the battery comprises one or more battery packs each including a plurality of battery cells;
    calculating an amount actually charged in the battery from a first point in time when the charging of the battery begins to a second point in time when the battery charging actually reaches a charge completion value; and
    calculating a state of health (SOH) of the battery, while the battery is being charged, wherein the SOH of the battery is calculated based on a ratio of i) the amount actually charged in the battery to ii) a preset charge amount expected to be charged from the first point in time to the second point in time,
    wherein the charge completion value is a state of charge (SOC) which is lower than 100%, or a voltage of the battery which is lower than the voltage, when the battery is fully charged.

10. The method of claim 9, further comprising setting the charge completion value used to calculate the SOH of the battery.

11. The method of claim 9, further comprising estimating a distance to empty (DTE) of the vehicle based on the calculated SOH.

12. The method of claim 9, further comprising calculating a state of charge (SOC) of the battery based on the calculated SOH.

13. The method of claim 9, wherein the charge completion value is a reference voltage of the battery.

14. The method of claim 9, wherein the charge completion value is a value measured when the battery is initially used after being produced.

15. The method of claim 9, wherein the charge completion value is a value measured while the battery is being charged when the battery is initially used.

16. The method of claim 9, wherein the charge completion value is an SOC of the battery.

17. A battery management system (BMS) of an electric vehicle having a battery, the BMS comprising:
    a reference setup device configured to set a charge completion value, wherein the battery comprises at least one battery pack;
    a charge amount calculator configured to calculate an amount actually charged in the battery during a time period ending when the battery charging reaches the charge completion value; and
    an SOH calculator configured to calculate the SOH of the battery, while the battery is being charged, wherein the SOH of the battery is calculated based on a ratio of i) the amount actually charged in the battery to ii) a preset charge amount expected to be charged during the time period, wherein the charge completion value is a state of charge (SOC) which is lower than 100%,
or a voltage of the battery which is lower than the voltage when the battery is fully charged.

18. The BMS of claim 17, wherein the time period is defined between a first point in time when charging of the battery begins and a second point in time when the battery charging actually reaches the charge completion value.

19. The BMS of claim 17, further comprising a communication unit configured to communicate a state of the battery to a controller of the BMS based on the calculated SOH.

20. The BMS of claim 17, wherein the SOH calculation unit calculates the SOH of the battery as represented in Equation 1:

$$\text{Aging} = \frac{Ah_{ActualInput}}{Ah_{ExpectedInput}} = \frac{\frac{Ah_{ActualInput}}{\Delta SOC_{ref1 \to ref2}}}{\frac{Ah_{ExpectedInput}}{\Delta SOC_{ref1 \to ref2}}} = \frac{Ah_{Aged}}{Ah_{BOL}} \quad \text{[Equation 1]}$$

wherein $Ah_{ActualInput} = Ah_{Aged}$ refers to an actual charge amount, and $Ah_{ExpectedInput} = Ah_{BOL}$ refers to an expected charge amount.

* * * * *